US006556154B1

(12) United States Patent
Gorecki et al.

(10) Patent No.: US 6,556,154 B1
(45) Date of Patent: Apr. 29, 2003

(54) OFFSET VOLTAGE CALIBRATION DAC WITH REDUCED SENSITIVITY TO MISMATCH ERRORS

(75) Inventors: James L. Gorecki, Hillsboro, OR (US); Yaohua Yang, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 573 days.

(21) Appl. No.: 09/053,251

(22) Filed: Mar. 31, 1998

(51) Int. Cl.[7] .......................... H03M 1/06; H03M 1/66
(52) U.S. Cl. .................... 341/118; 341/136; 341/145
(58) Field of Search ................................ 341/118, 120, 341/121, 122, 156, 161, 136, 145; 330/9, 51, 129, 253, 256, 295; 326/41; 327/103; 333/22 R; 323/315; 708/801

(56) References Cited

U.S. PATENT DOCUMENTS

| 4,272,760 A | 6/1981 | Prazak et al. ............... 341/120 |
| 4,282,515 A | 8/1981 | Patterson, III ............. 341/118 |

(List continued on next page.)

OTHER PUBLICATIONS

"The Art of Electronics," Paul Horowitz and Winfield Hill, Cambridge University Press, 2d Edition, 1989, pp. 612–624.
"The Electrical Engineering Handbook," Richard C. Dorf, Editor, CRC Press, Inc., 1993, pp. 771–783.
Scott D. Willingham, Kenneth W. Martin, and A. Ganesan, "A BiCMOS Low–Distortion 8–MHz Low–Pass Filter", IEEE Journal of Solid–State Circuits, vol. 28, No. 12, Dec. 1993, pp. 1234–1245.

"TLC4502, TLC4502A, TLC4502Y Advanced LinEPIC™ Self–Calibrating (Self–Cal™) Precision Dual Operational Amplifiers," Data Sheet Abstract, Texas Instruments, Inc. (http://www.ti.com/sc/psheets/abstract/datasht/slos161c.htm, Mar. 30, 1998) 2 pages.
"TLC4502, TLC4502A, TLC4502Y Advanced LinEPIC™ Self–Calibrating (Self–Cal™) Precision Dual Operational Amplifiers," Texas Instruments, Inc. (http://www–s.ti.com/sc/psheets/slos161c/slos161c.pdf, Mar. 30, 1998) 32 pages.
"Self–Cal™ op amp with digital offset nulling," Mixed–Signal & Analog Showcase, Texas Instruments, Inc. (http://www.ti.com/sc/docs/msp/showcase/vol20/showpg07.htm, Jan. 15, 1998) 3 pages.
"A High–Performance Autozeroed CMOS Opamp with 50μV Offset," F. Krummenacher, R. Vafadar, A. Ganesan and V. Valence, IEEE International Solid State Circuits Conference, Session 21, Amplifiers, Paper SA 21.3., 1997, Digest of Technical Papers, pp. 350–351; slide supplement, pp. 274–275.
"The Circuits and Filters Handbook," Wai–Kai Chen, Editor, CRC Press, Inc., Chicago, Illinois, 1995, pp. 2072–2127.

*Primary Examiner*—Patrick Wamsley
(74) *Attorney, Agent, or Firm*—Campbell Stephenson Ascolese LLP

(57) ABSTRACT

A composite digital-to-analog converter (DAC) includes a first DAC and a second DAC. The first DAC has a first range and a first error. The second DAC has a second range and a second error. The second range of the second DAC is less than the first range of the first DAC. The second range of the second DAC is greater than the first error of the first DAC. The second error of the second DAC is less than the first error of the first DAC. The composite DAC has a composite range and a composite error. The second DAC is coupled to minimize the composite error such that the composite range of the composite DAC is the first range and the composite error of the composite DAC is the second error.

25 Claims, 6 Drawing Sheets

U.S. PATENT DOCUMENTS

| | | | |
|---|---|---|---|
| 4,290,023 A | 9/1981 | Greenfield | 330/9 |
| 4,314,235 A | 2/1982 | Ruf et al. | 341/122 |
| 4,356,450 A | 10/1982 | Masuda | 330/9 |
| 4,395,681 A | 7/1983 | Hornung et al. | 330/259 |
| 4,495,470 A | 1/1985 | Bristol | 330/9 |
| 4,554,511 A | 11/1985 | Braun | 330/9 |
| 4,724,397 A | 2/1988 | Davis | 330/256 |
| 4,810,973 A | 3/1989 | Kurz | 330/129 |
| 4,933,643 A | 6/1990 | Jandu et al. | 330/9 |
| 4,940,981 A | 7/1990 | Naylor et al. | 341/161 |
| 4,947,169 A | 8/1990 | Smith et al. | 341/121 |
| 4,983,926 A | 1/1991 | Groehl | 330/51 |
| 4,998,108 A * | 3/1991 | Ginthner et al. | 341/145 |
| 5,047,665 A | 9/1991 | Burt | 330/253 |
| 5,107,146 A | 4/1992 | El-Ayat | 326/41 |
| 5,124,663 A | 6/1992 | McEntarfer et al. | 330/9 |
| 5,148,121 A | 9/1992 | Uchida | 330/295 |
| 5,287,108 A | 2/1994 | Mayes et al. | 341/156 |
| 5,412,387 A * | 5/1995 | Vinclette et al. | 341/150 |
| 5,493,205 A | 2/1996 | Gorecki | 323/315 |
| 5,510,738 A | 4/1996 | Gorecki et al. | 327/103 |
| 5,574,678 A | 11/1996 | Gorecki | 708/801 |
| 5,617,064 A | 4/1997 | Gorecki | 333/22 R |
| 5,666,118 A | 9/1997 | Gersbach | 341/120 |

* cited by examiner

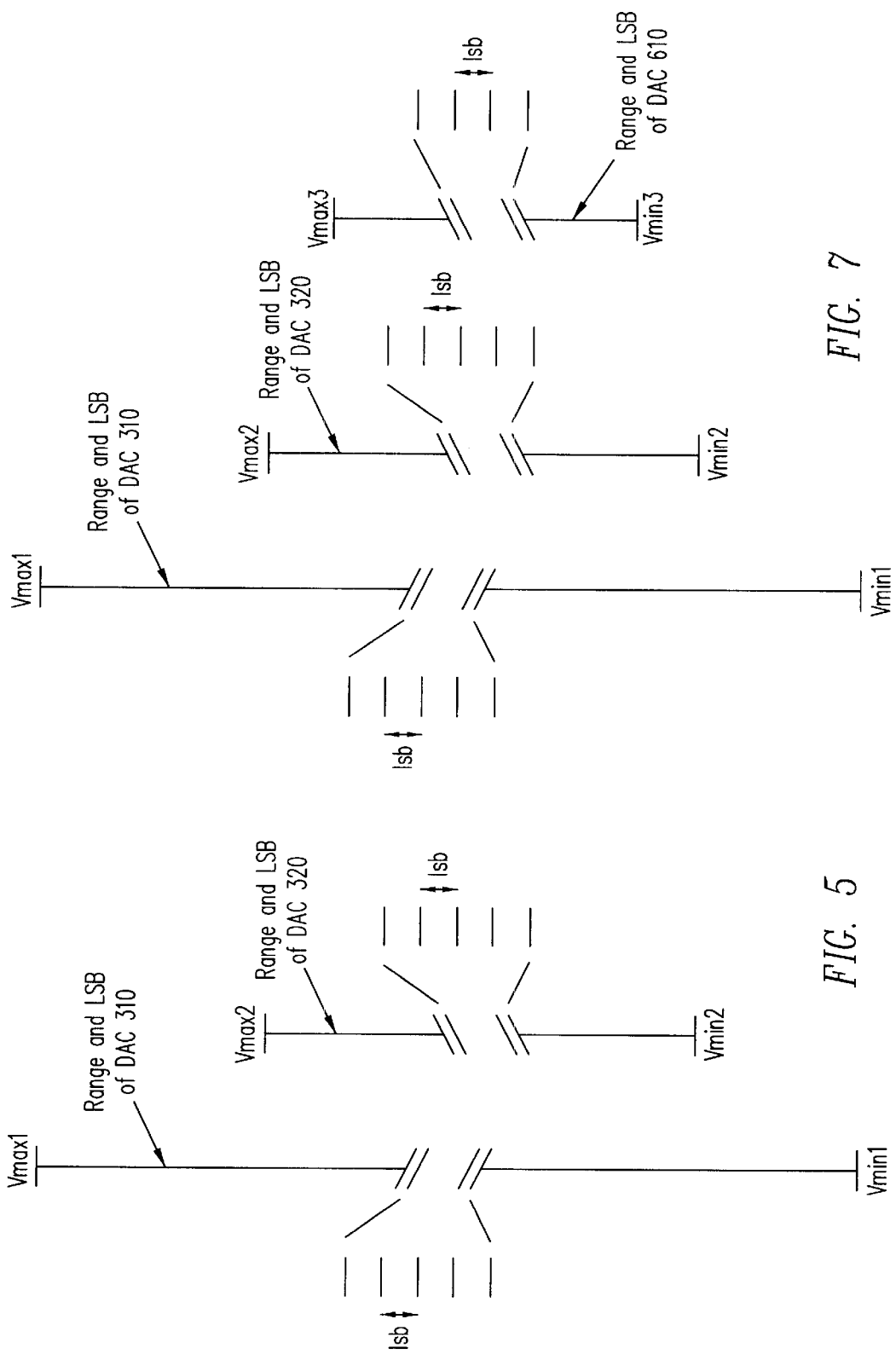

OFFSET VOLTAGE CALIBRATION DAC WITH REDUCED SENSITIVITY TO MISMATCH ERRORS

BACKGROUND

1. Field of the Invention

The present invention relates to circuits, and, more particularly, to accurate compensation of analog offset values and to accurate digital-to-analog signal conversion.

2. Description of the Related Art

All analog circuits exhibit some output offset voltage $V_{OS}$, due to inherent mismatch of transistors. For example, a typical problem associated with operational amplifiers is that of a fixed offset voltage $V_{OS}$. This error appears as a fixed deviation in the expected output due to imbalances in the operational amplifier. Even when an operational amplifier's two input voltages are equal, the output node has a voltage value offset from zero. Such offset becomes especially problematic where low level signals are utilized. In order to increase the precision of such operational amplifiers and other analog circuits, it is necessary to compensate for such offset.

There are several techniques to reduce or eliminate offset in analog circuits. For example, laser thin-film resistor trimming at the time of manufacture and fuse-link zapping to adjust resistor sizes each provide some measure of correction for $V_{OS}$ Digital-to-analog converters (DACs) are typically adjusted or trimmed at the time of manufacture to minimize integral nonlinearity (INL) and differential nonlinearity (DNL) errors. Variable resistances may be used to compensate for $V_{OS}$, but the use of such variable resistances becomes problematic when such resistances are integrated with the compensated circuit. Such problems arise, for example, because manipulation of the variable resistance becomes difficult, and the compensating resistor is subject to ambient conditions in the integrated circuit. Calibration can also be used to correct for $V_{OS}$. Calibration is typically performed on demand rather than at the time of manufacture.

DACs with successive approximation register (SAR) control have been used to create analog-to-digital converters (A/D converters or ADCs) and have been used in many integrated and discrete calibration schemes. For example, the TLC4501 operational amplifier available from Texas Instruments, Incorporated of Dallas, Tex. includes $V_{OS}$ calibration using a DAC. However, present techniques which operate with a successive approximation register in a feedback loop for calibration are dependent upon the accuracy of the DAC in the feedback loop.

One factor that determines the accuracy of a DAC is resolution. The resolution of a DAC is defined by the smallest average change possible in the output analog signal. The resolution of a DAC is determined by the total number of digital codes and the full scale DAC output. DAC linearity is usually specified in terms of the least significant bit (LSB) of the DAC. For example, in the context of voltage, an exemplary DAC may have a full scale range from ground to a reference voltage $V_{REF}$ (e.g., a full scale range having a magnitude of $V_{REF}$). An N-bit input digital code allows for $2^N$ quantization levels, or more precisely 0 to $2^N-1$ steps between zero and $V_{REF}$. Thus, the minimum change that a DAC can resolve is a step voltage of $V_{REF}/2^N$. This minimum step voltage defines the resolution of the DAC and is commonly referred to as the least significant bit or LSB of the DAC. That is, the least significant bit is equal to the full-scale range of the DAC divided by the number of steps. Thus, the output range of an N-bit DAC is equally divided into $2^N$ units, and one least significant bit (LSB) change in the input digital word makes the analog output voltage change by $V_{REF}/2^N$. As the number of bits increases, the step size (i.e., the LSB) decreases, thereby increasing the accuracy of the system when a conversion is made between an analog and digital signal.

Another factor that determines the accuracy of a DAC is linearity. Integral linearity is a measure of linearity over the entire conversion range. Differential linearity is the linearity between code transitions (e.g., linearity of each step). Integral linearity is a measure of the monotonicity of the DAC. A DAC is said to be monotonic if increasing input codes result in increasing output values. Differential nonlinearity (DNL) is a measure of the deviation of the actual DAC output step from the ideal step of $V_{REF}/2^N$ (i.e., 1 LSB). The accuracy in linearity values of a DAC are typically specified in the DAC's data sheet in units of the LSB. Because linearity can vary with temperature, linearity values are often specified at particular temperature values.

Thus, a single DAC is limited by its resolution and nonlinearities and is typically adjusted, trimmed or otherwise calibrated as discussed above.

SUMMARY

It has been discovered that a composite DAC employing multiple independent DACs may be used to more precisely compensate for offset voltage. Such a configuration provides the advantage that a full calibration range may be maintained while increasing the accuracy of the digital-to-analog conversion. For example, the range of a first DAC determines the range of calibration while the presence of a successive, more accurate, independent DAC or DACs determines the accuracy of the calibration. Such a configuration advantageously minimizes integral and differential nonlinearity errors while not requiring adjustment or trimming of the DACs. Such a configuration provides the further advantage of more precise on-chip calibration which eliminates the need for trimming or other adjustment.

An on-chip calibration of analog offset is advantageously provided using an SAR-based structure which implements a calibration operation to adjust a composite DAC which in turn adjusts the input-referred offset of an analog circuit such as an amplifier. The accuracy of the calibration is determined by the resolution and accuracy of the DAC employed in the calibration operation. By using a composite DAC, a structure and method are provided to reduce the error of the calibration below the error of a single, wide-range DAC while maintaining the full calibration range of the wide-range DAC and without requiring the adjustment or trimming of the DAC(s).

For example, a first DAC of a composite DAC may be operated to calibrate an analog signal to within a first DAC error of a target value. A second DAC of the composite DAC may be operated to calibrate the analog signal to within a second DAC error of the target value after the first DAC has been operated. The second DAC has a range less than the range of the first DAC and greater than the error of the first DAC. The composite DAC including the first and second DACs has the range of the first DAC and the error of the second DAC. The process may be repeated with subsequent DACs. Thus, a composite DAC including first, second and third DACs has the range of the first DAC and the error of the third DAC. Generally, a composite DAC has the range of the first DAC and the error of the last DAC in a series of successively operated DACs.

In one embodiment of the invention, a composite digital-to-analog converter (DAC) includes a first DAC and a second DAC. The first DAC has a first range and a first error. The second DAC has a second range and a second error. The second range of the second DAC is less than the first range of the first DAC. The second range of the second DAC is greater than the first error of the first DAC. The second error of the second DAC is less than the first error of the first DAC. The composite DAC has a composite range and a composite error. The second DAC is coupled to minimize the composite error such that the composite range of the composite DAC is the first range and the composite error of the composite DAC is the second error.

In another embodiment of the invention, an apparatus includes a composite DAC. The composite DAC includes a first DAC, a second DAC and a selection circuit. The first DAC has a first range and a first error. The second DAC has a second range and a second error. The second range is less than the first range and more than the first error. The second DAC is coupled to minimize error of the composite DAC such that the composite DAC has the first range and the second error. The selection circuit is coupled to the first and second DACs for alternately selecting one of the first and second DACs.

In another embodiment of the invention, a method of minimizing analog circuit offset is provided. The method includes the following: operating a first DAC to calibrate an analog signal to within a first DAC error of a target value; and operating a second DAC to calibrate the analog signal to within a second DAC error of the target value after operating the first DAC. The second DAC has a range less than a range of the first DAC and greater than the first DAC error.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

FIG. 5 shows the range and least significant bits of DACs of the composite DAC of FIG. 3.

FIG. 7 shows the range and least significant bits of DACs of the composite DAC of FIG. 6.

DETAILED DESCRIPTION

The following description is intended to be illustrative of the invention and should not be taken to be limiting. Rather, any number of variations may fall within the scope of the invention which is defined in the claims following the description.

Figure 1:
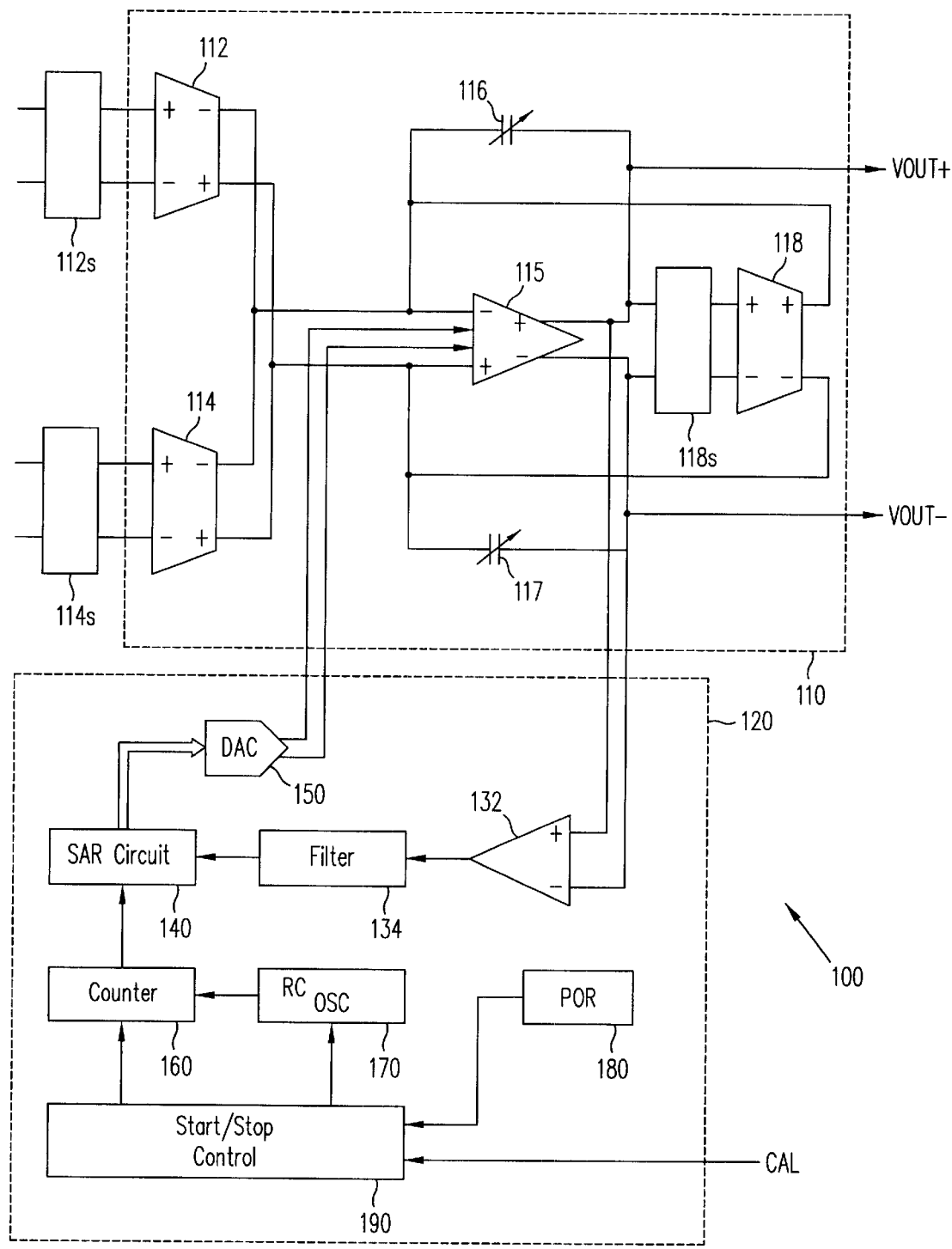
FIG. 1 shows a block diagram of a self-calibrated analog circuit in accordance with the invention.

FIG. 1 shows an exemplary self-calibrated circuit 100 in accordance with the invention. Self-calibrated circuit 100 includes configurable analog block 110 and calibration circuit 120. Configurable analog block 110 is an exemplary analog circuit having an offset voltage $V_{OS}$. Calibration circuit 120 detects the offset voltage $V_{OS}$ of configurable analog block 110 and provides another input referred offset voltage $V_{CAL}$ to configurable analog block 110 to counteract the offset voltage $V_{OS}$.

Configurable analog block 110 includes input switch circuits 112s, 114s, input transconductors 112, 114, differential amplifier 115, programmable capacitor arrays 116, 117, feedback switch circuit 118s and feedback transconductor 118. Switch circuits 112s, 114s are coupled to the input terminals of input transconductors 112, 114, respectively. The negative output terminals of input transconductors 112, 114 are coupled to the negative input terminal of amplifier 115. The positive output terminals of input transconductors 112, 114 are coupled to the positive input terminal of amplifier 115. Programmable capacitor arrays 116, 117 are coupled between respective inputs and outputs of amplifier 115. The outputs of amplifier 115 are provided as outputs of the configurable analog block 110. The outputs of amplifier 115 are also provided to the inputs of feedback transconductor 118 via feedback switch circuit 118s and to the programmable capacitor arrays 116, 117.

During normal operation, the positive output terminal of feedback transconductor 118 is coupled to the negative input terminal of amplifier 115 via a positive switch of switch circuit 118s. Also during normal operation, the negative output terminal of feedback transconductor 118 is coupled to the positive input terminal of amplifier 115 via a negative switch of switch circuit 118s. During calibration operation, switch circuits 112s, 114s, 118s decouple the inputs of transconductors 112, 114, 118 from their respective, normal operation inputs and couple the inputs of transconductors 112, 114, 118 to a virtual ground. For example, the virtual ground may be a 2.5V reference node for a 5V part. The 2.5V is generated by a reference circuit or chip.

One example of a configurable analog block 110 is described in U.S. Pat. No. 5,574,678, entitled "Continuous Time Programmable Analog Block Architecture," naming James L. Gorecki as inventor, and which is incorporated herein by reference.

Figure 2A:
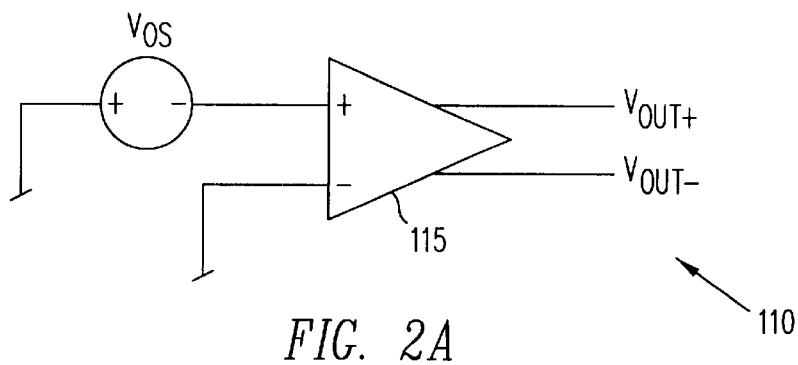
FIG. 2A shows a simplified circuit diagram of an exemplary analog circuit with an offset voltage.

The offset voltage $V_{OS}$ of configurable analog block 110 is equal to $V_{OUT+}$ minus $V_{OUT-}$. Offset voltage $V_{OS}$ is caused by the offset of transconductors 112, 114, 118 and amplifier 115 of FIG. 1. FIG. 2A shows a simplified circuit model of configurable analog block 110 including amplifier 115. The negative input of amplifier 115 is coupled to virtual ground. The offset voltage $V_{OS}$ is represented by the voltage source so labeled and having a positive terminal coupled to virtual ground and a negative terminal coupled to the positive input of amplifier 115.

Figure 2B:
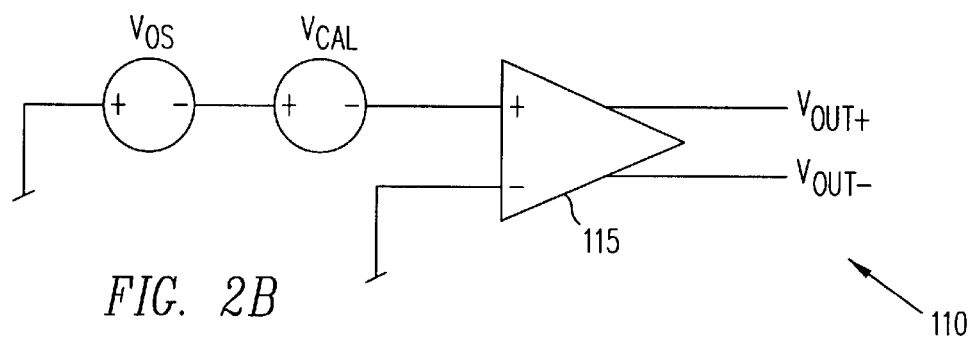
FIG. 2B shows a circuit diagram of the analog circuit of FIG. 2 with a calibration voltage according to the invention.

Referring to FIG. 2B, calibration circuit 120 provides a calibration voltage $V_{CAL}$. The calibration voltage $V_{CAL}$ is represented in FIG. 2B by a voltage source having a positive terminal coupled to the negative terminal of the $V_{OS}$ voltage source and a negative terminal coupled to the positive input of amplifier 115. The calibration voltage $V_{CAL}$ compensates for the offset voltage $V_{OS}$ of configurable analog circuit 110. When $V_{OS}$ equals $-V_{CAL}$, there is no observed offset at the output of configurable analog block 110. More specifically, referring to FIG. 2C, the input referred offset voltage $V_{OS}$ causes a current error $\Delta i_{v_{os}}$ in the input stage of amplifier 115:

$$\Delta i_{VOS} = g_{mp} \cdot V_{OS}$$

where $g_{mp}$ is the transconductance value of each transistor of the differential input pair P1, P2. Composite DAC 150 of calibration circuit 120 (further described hereinafter) generates equal and opposite currents to correct the current error. The input referred calibration voltage $V_{CAL}$ generated by calibration circuit 120 is defined as follows:

$$V_{CAL} = i_{DAC} / g_{mp}$$

where $i_{DAC}$ is differential current provided by DAC 150, and $g_{mp}$ is as defined above. Therefore, the total input referred offset voltage $V_{OFF}$ is as follows:

$$V_{OFF} = V_{CAL} + V_{OS} = i_{DAC}/g_{mp} + V_{OS}$$

where $V_{CAL}$, $V_{OS}$, $i_{DAC}$ and $g_{mp}$ are as defined above.

Composite DAC 150 is formed of the same devices as the amplifier differential input pair P1, P2 and is biased with the same scaled bias current as the input pair P1, P2. So:

$$i_{DAC} \propto \beta \sqrt{\frac{I_{DAC}}{K_P}}$$

(where $\beta$ corresponds to the DAC code and varies from zero to one, and transconductance coefficient $K_P = (\mu C_{OX} W)/2L$ where $\mu$ is the transistor channel surface mobility of holes, $C_{OX}$ is the density of gate oxide capacitance and W/L is the transistor gate aspect ratio (transistor channel width/length)); and $$g_{mp} \propto \sqrt{\frac{I_O}{K_P}};$$

(where $I_O$ is the bias current) therefore, $$V_{CAL} = \beta \sqrt{\frac{I_{DAC}}{I_O} \cdot \frac{K_P}{K_P}}$$

After canceling $K_P$, the ratio of $I_{DAC}$ to $I_O$ is shown to be fixed and temperature independent. So, $V_{CAL}$ is essentially independent of temperature. $V_{OS}$ is also essentially independent of temperature because $$\frac{\partial \Delta V_T}{\partial T} \cong 0$$

where $\Delta V_T$ is the threshold voltage mismatch of CMOS differential pairs and T is the temperature.

Referring again to FIG. 1, self-calibrated circuit 100 includes calibration circuit 120 to control compensation for the above described offset of configurable analog block 110. Calibration circuit 120 includes differential-to-single-ended converter and comparator latch 132, digital filter 134, SAR circuit 140, composite DAC 150, counter 160, oscillator 170, power on reset (POR) circuit 180 and start/stop control circuit 190. Start/stop control circuit 190 receives a reset signal from POR 180 and a calibration signal CAL from an external pin. Start/stop control circuit 190 provides control signals to oscillator 170 and counter 160 to start and stop calibration. Oscillator 170 provides a clock signal to counter 160. Counter 160 provides a count value to SAR circuit 140. SAR circuit 140 provides a digital representation to composite DAC 150 of an offset indicator signal received from amplifier 115 via converter and latch 132 and digital filter 134. Composite DAC 150 provides the equal and opposite currents of FIG. 2C to amplifier 115. The equal and opposite currents are generated to within the resolution of composite DAC 150 plus or minus the error of composite DAC 150.

Figure 3:
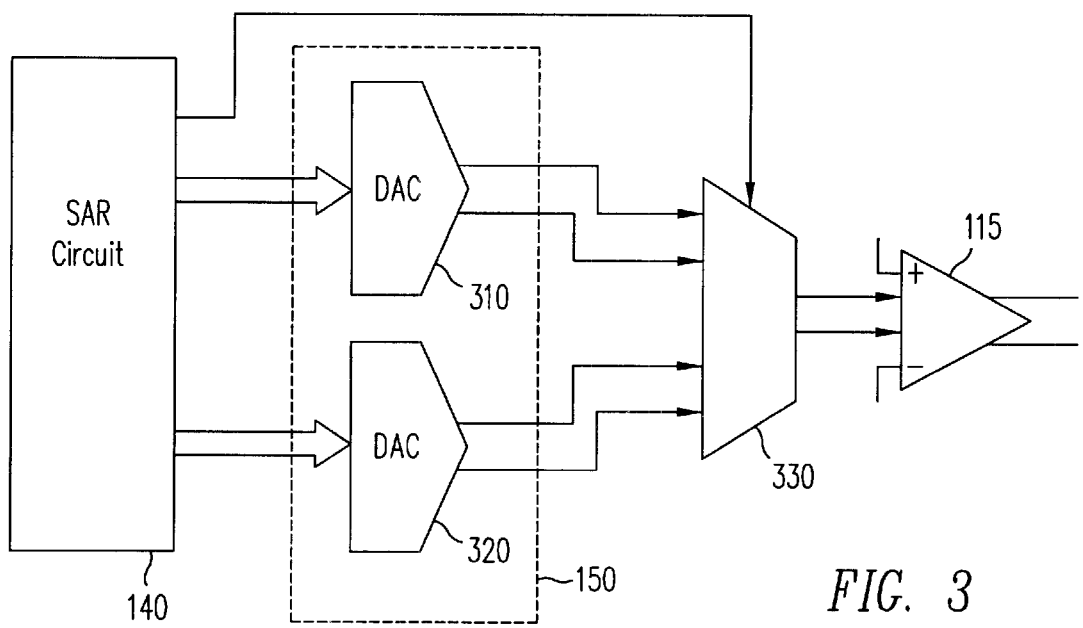
FIG. 3 shows a block diagram of one embodiment of an SAR controlled composite DAC according to the invention.

Referring to FIG. 3, composite DAC 150 is a composite DAC including independent DACs 310 and 320. DACs 310, 320 are used successively in the calibration operation of self-calibrated circuit 100. (The calibration operation is discussed hereinafter with reference to FIG. 4.) Generally, a first iteration within the calibration operation uses DAC 310 to cancel or minimize the offset voltage $V_{OS}$ of the configurable analog block 110 to within the resolution of DAC 310. That is, to within one least significant bit of DAC 310 plus or minus the error of DAC 310. After the first iteration, a second iteration within the calibration operation uses the second DAC 320 to cancel or minimize the residual error of the first DAC 310. Composite DAC 150 has the resolution of the last DAC of composite DAC 150 (e.g., DAC 320). DACs 310, 320 are selectively coupled to amplifier 115 via select circuit 330 which is controlled by SAR circuit 140.

Figure 4:
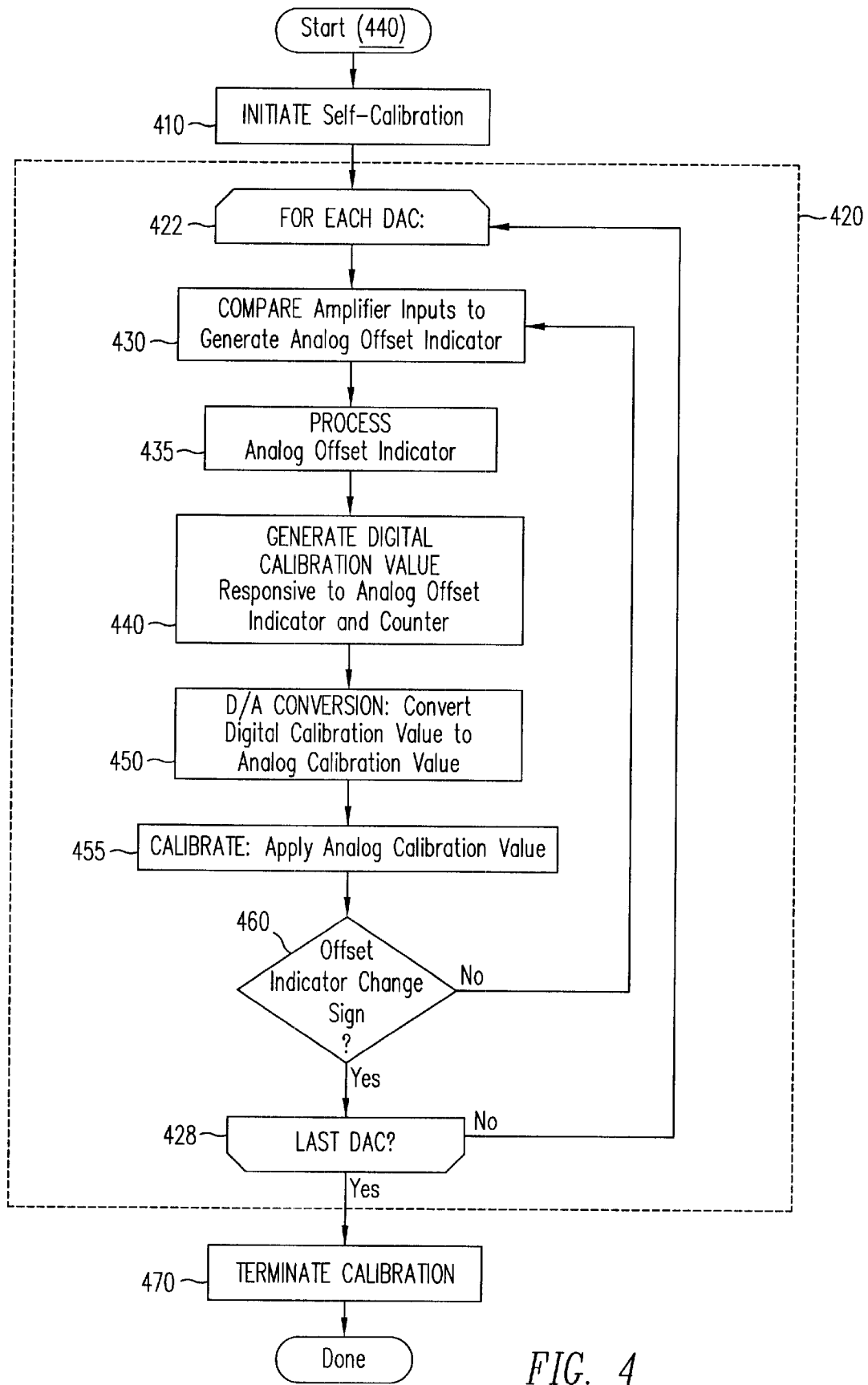
FIG. 4 shows a flow chart of a calibration operation in accordance with the invention.

FIG. 4 shows a flow chart of a calibration operation in accordance with the invention. Although for the purpose of explanation the operations of the flow chart of FIG. 4 are shown to occur in a particular order, the operations of FIG. 4 may actually occur in a different order or in a substantially parallel fashion (e.g., within the loop including amplifier 115, converter and latch 132, filter 134, SAR circuit 140 and DAC 150).

During initiate operation 410, calibration is initiated for configurable analog block 110. Calibration is initiated by start/stop control circuit 190 upon receipt of a start signal such as a power-on reset signal from POR 180 or upon assertion of an external pin CAL, for example. Configurable analog block 110 is isolated from its normal operating environment during initiate operation 410. For example, switches 112s, 114s, 118s switch the inputs of respective transconductors 112, 114, 118 from normal operation nodes to a virtual ground node. When configurable analog block 110 is isolated, configurable analog block 110 is open-loop configured, and amplifier 115 acts as a comparator during subsequent calibration. Also during initiate operation 410, counter 160 is reset and oscillator 170 is started.

After initiate operation 410, a set of DAC iterations of loop 420 are executed to compensate for the offset voltage $V_{OS}$ of configurable analog block 110. As shown in FIG. 4, an iteration of loop 420 is executed for each of DACs 310, 320 of composite DAC 150. Specifically, a first iteration of loop 420 is executed using DAC 310 and a second iteration of loop 420 is executed using DAC 320.

During compare operation 430 of the first iteration of loop 420, the inputs of amplifier 115 are coupled to virtual ground, and the resulting output signal of amplifier 115 is an offset indicator providing a discrete representation indicating the direction of the analog offset value $V_{OS}$. During process operation 435, the offset indicator is processed for subsequent analysis. For example, as shown in FIG. 1, offset indicator is converted to a single ended signal by converter and latch 132 and then filtered by digital filter 134.

During generate digital calibration value operation 440, SAR circuit 140 receives a count value from counter 160 and the processed offset indicator from digital filter 134. SAR circuit 140 generates a digital calibration value according to known SAR techniques. The digital calibration value is provided to DAC 310 of composite DAC 150.

Figure 2C:
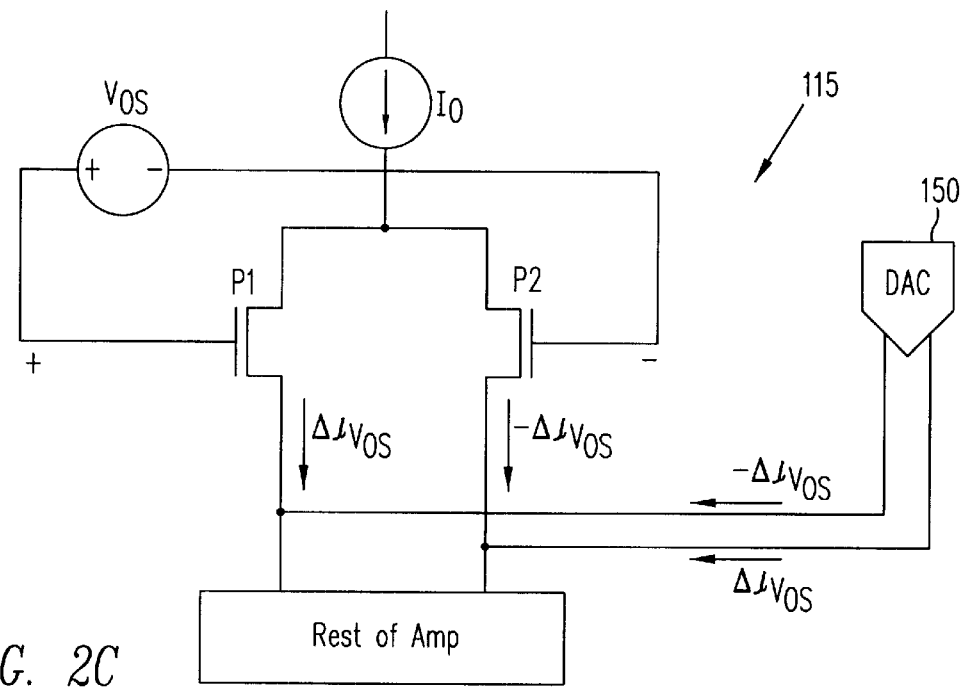
FIG. 2C shows a circuit diagram of an amplifier with an offset voltage and a corresponding differential DAC generated calibration voltage according to the invention.

During D/A conversion operation 450, DAC 310 converts the digital calibration value received from SAR circuit 140 into an analog calibration current. As shown in FIG. 2C, during calibrate operation 455, the analog calibration current generated by DAC 310 is differentially applied to amplifier 115 to cancel the offset current resulting from the offset voltage $V_{OS}$. Referring again to FIG. 4, during decision 460, SAR circuit 140 determines if the offset indicator has changed sign indicating that the analog calibration current is within a least significant bit of compensating configurable analog block 110. If the offset indicator has not changed sign, operations 430–455 are repeated with a different count value.

After a positive resolution of decision 460 and during last DAC decision 428, SAR circuit 140 determines if the current DAC 310 is the last DAC of composite DAC. In the present example, because DAC 320 remains, SAR circuit 140 begins a second iteration of loop 420 with the remaining DAC 320. The second iteration of loop 420 is executed similarly to the first iteration except that DAC 320 is selected instead of DAC 310. After the second iteration of loop 420, DAC 320 is the DAC of the current iteration and is the last DAC. Consequently, SAR circuit 140 terminates loop 420.

After the last DAC iteration of loop 420 is complete and during terminate calibration operation 470, the switches 112s, 114s, 118s are controlled to decouple the inputs of transconductors 112, 114, 118 from the virtual ground and to recouple configurable analog block 110 for normal operation. The application of the calibration current $I_{DAC}$ to amplifier 115 is maintained to compensate the offset current of configurable analog block 110 during normal operation.

Referring again to FIG. 3, DAC 310 is an 8-bit DAC, and DAC 320 is a 5-bit DAC. Referring to FIG. 5, DAC 310 has a range $V_{R310}$ equal to $V_{MAX1}-V_{MIN1}$, and DAC 320 has a range $V_{R320}$ equal to $V_{MAX2}-V_{MIN2}$. The range $V_{R320}$ of DAC 320 is less than the range $V_{R310}$ of DAC 310. The value of the least significant bit of DAC 310 is equal to the value of the least significant bit of DAC 320. Thus, DAC 320 has a smaller range than DAC 310, but DAC 320 has the same least significant bit value as DAC 310.

For 8-bit DAC 310 with a range of $V_{R310}$, there are 255 possible outputs, and the least significant bit is equal to $V_{R310}/255$. Similarly, for 5-bit DAC 320 with a range of $V_{R320}$, there are 63 possible outputs, and the least significant bit is equal to $V_{R320}/63$. Although the ranges of DACs 310, 320 are here expressed in terms of a range of output voltage $V_{CAL}$, the ranges may also be expressed in terms of a range of output current $I_{DAC}$.

Figure 8A:
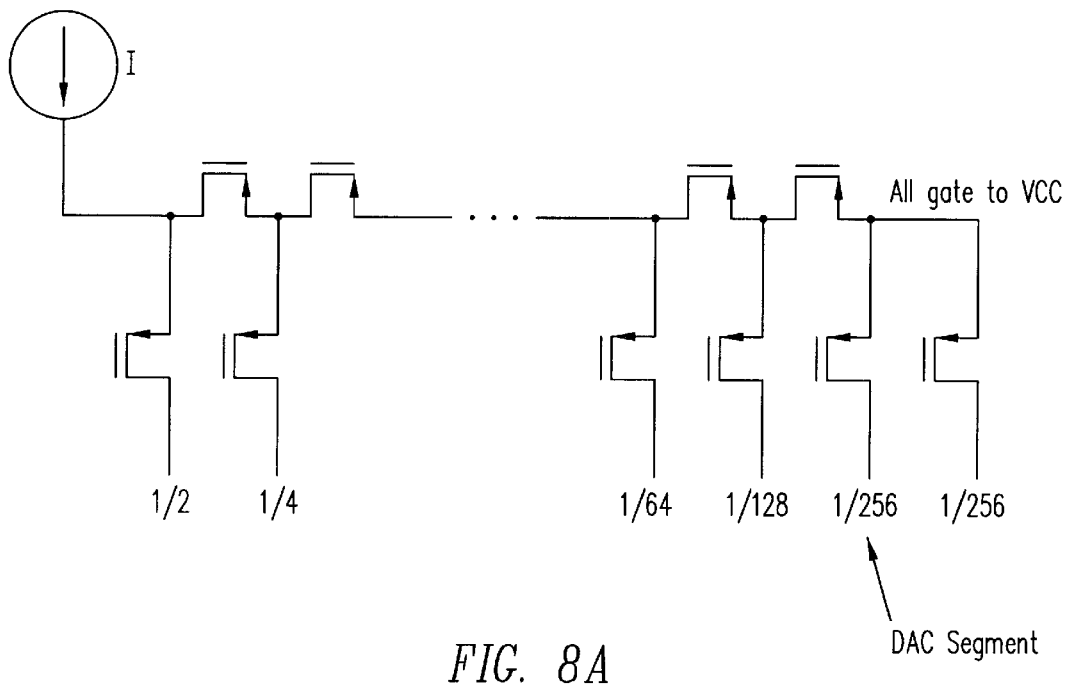
FIG. 8A shows an 8-bit MOS R-2R DAC string.
Figure 8B:
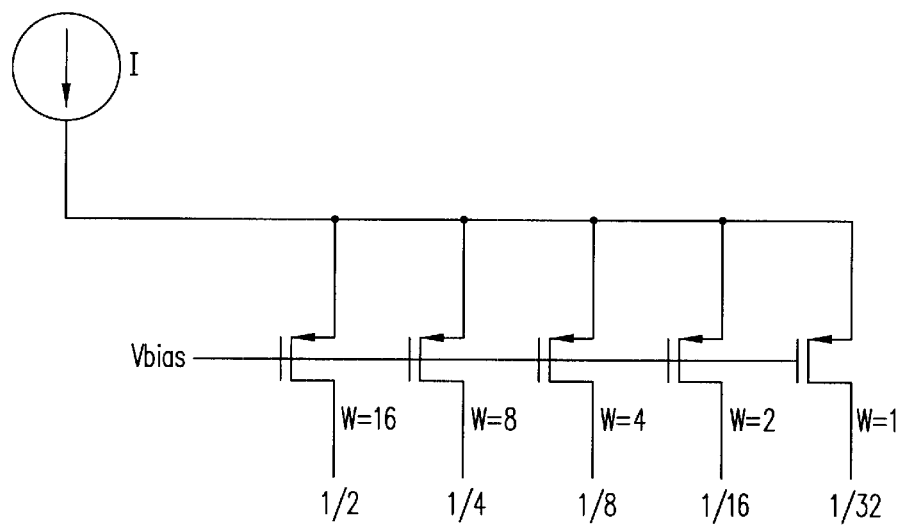
FIG. 8B shows a 5-bit binarily weighted MOS DAC string.

The error of any DAC segment is a random independent variable weighted by the value of that DAC segment. Referring to FIGS. 8A and 8B; for a current based MOS R-2R DAC or binarily weighted current DAC the mismatch is predominantly due to threshold voltage $V_T$ mismatch of the transistors forming the DAC. In this case, the output current of each segment will be proportional to $W_i(1+X)$, where X is a random variable determined by the $V_T$ mismatch. The number and size of DACs 310, 320 is selected depending upon the $V_T$ mismatch of the process and the final calibration accuracy desired.

Although a particular current value is required to exactly compensate for $V_{OS}$, a single DAC is only capable of generating a current within a least significant bit of the required current, plus or minus any nonlinearities of composite DAC 150. For a given Gaussian probability density function of the $V_T$ mismatch, a typical maximum INL or DNL of an 8-bit M-2M DAC 310 (e.g., a MOS-based R-2R DAC) is on the order of 18 LSBs. So, compensation is limited to within 18LSB 3σ.

However, because DAC 320 has the same least significant bit size and a smaller range $V_{R320}$ than DAC 310, the maximum INL or DNL of DAC 320 is a smaller percentage. A typical maximum INL or DNL of 5-bit DAC 320 is on the order of 3 LSBs. If the range $V_{R320}$ of DAC 320 is greater than the maximum nonlinearity error of DAC 310, then the accuracy of the final calibration after both iterations of loop 420 will be the maximum nonlinearity of DAC 320. After the first iteration of loop 420, DAC 310. has compensated configurable analog block 110 to within 18 LSBs. Thus, the range of DAC 320 is selected to be greater than 18 LSBs. After the second iteration of loop 420, DAC 310 has compensated configurable analog block 110 to within 3 LSBs. Consequently, the overall error of composite DAC 150 is much lower and results in a final resolution of the calibration being equal to 3 LSBs.

The ratio of the maximum INL errors of DACs 310, 320 is as follows:

$$\frac{\text{Max}INL_{310}}{\text{Max}INL_{320}} = \frac{\sum_{i=0}^{N-1} |2^i \cdot X_i|}{\sum_{j=0}^{M-1} |2^j \cdot X_j|}$$

where N is the order of DAC 310, M is the order of DAC 320, and M<N. The DNL is similarly scaled though the exact mathematical formulation of the maximum DNL error is more complicated.

For the same statistics of the random variable probability density function X and hence $V_T$ mismatch, the maximum error is less for DAC 310 than DAC 320. If the range of DAC 320 subsumes the maximum error of DAC 310, then the resultant resolution of composite DAC 150 is limited by the accuracy of DAC 320. Thus, composite DAC 150 has the high range of DAC 310 and the low error of DAC 320.

The above description is intended to describe at least one example of the invention. Consequently, the above description is not intended to define the scope of the invention. Rather, the scope of the invention is defined in the claims below. Thus, other examples of the invention include various modifications, additions, and/or improvements to the above description.

For example, in the above description, a configurable analog block 110 is compensated for an analog voltage offset. However, the invention is not limited to such an analog circuit. Rather, configurable analog block 110 is merely provided as an example of an analog circuit having a voltage offset which may be compensated in accordance with the invention. Any analog circuit having an offset may be compensated in accordance with the invention.

Figure 6:
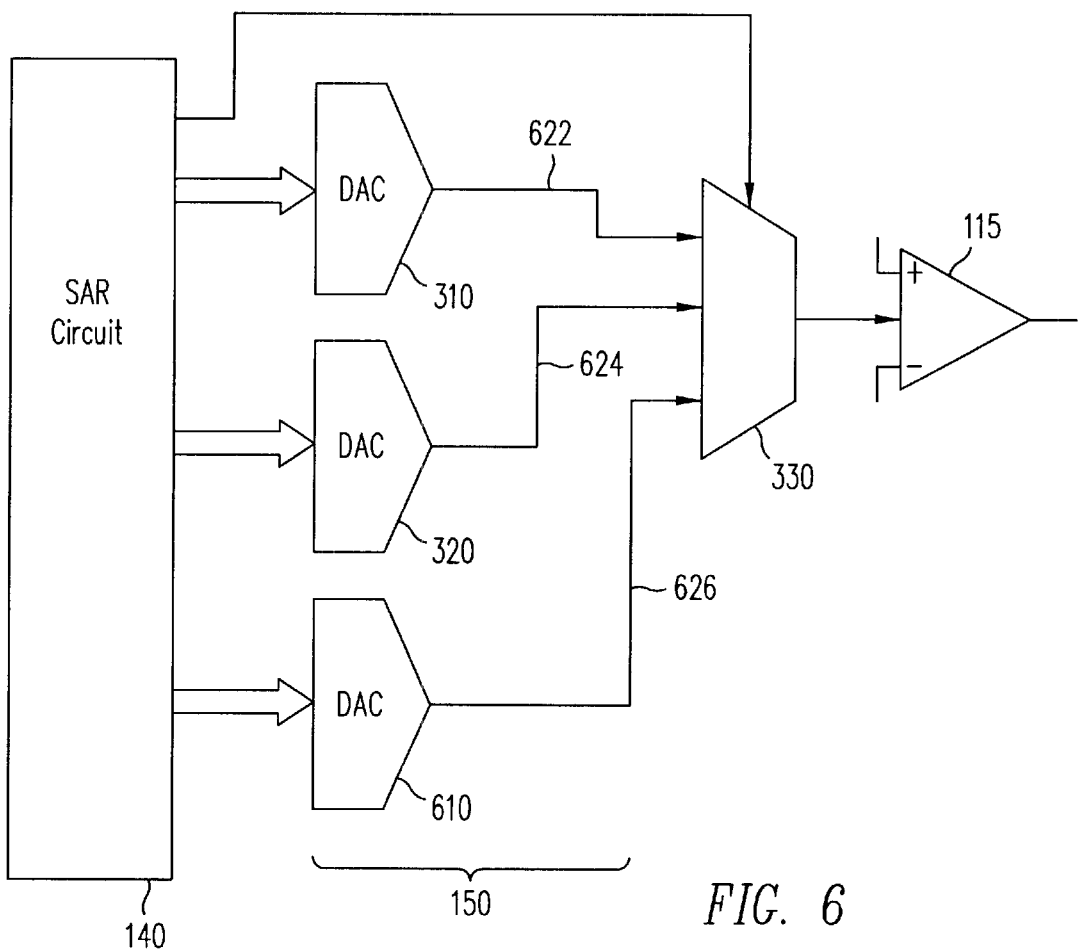
FIG. 6 shows a block diagram of another embodiment of an SAR controlled composite DAC according to the invention.

Also, although the above discussion demonstrates a composite DAC 150 including two independent DACs 310 and 320, additional DACs may be used in the calibration operation if greater accuracy is desired. Referring to FIG. 6, for example, composite DAC 150 may include a third DAC 610. Referring to FIG. 7, DAC 610 has a range smaller than the second DAC 320 range but larger than the error of the second DAC 320. Additional DAC 610 may have the same least significant bit size as that of the previous DACs 310, 320. Additional DAC 610 may be used to cancel the residual error of the two previous DACs 310, 320. For example, an additional 3-bit DAC 610 can reduce the composite DAC DNL from the above described 3 LSBs to a lower value of 1.2 LSBs. Any number of DACs may be used to achieve any desired accuracy.

FIG. 8A shows a representative 8-bit MOS R-2R DAC 310 string, and FIG. 8B shows a 5-bit binarily weighted MOS DAC 320 string. Such DAC circuit types are provided for purposes of illustration. Any type of DAC circuit or combination of DAC circuits may be used for DACs 310, 320. For example, bipolar, resistor or capacitor DACs may be used. The DACs of composite DAC 150 may be segmented DACs. Also, differential or single-ended DACs may be used. For example, DACs 310, 320, 610 of FIG. 6 are shown in a single-ended architecture.

Those skilled in the art will recognize that circuit elements in circuit diagrams and boundaries between logic blocks are merely illustrative and that alternative embodiments may merge logic blocks or circuit elements or impose an alternate decomposition of functionality upon various logic blocks or circuit elements. For example, although select circuit 330 is shown in FIG. 3 as being separate from composite DAC 150, select circuit may be integral with DAC 150. Similarly, the operations given in the above description are for illustration only. Operations may be combined or the functionality of the operations may be distributed in additional operations in accordance with the invention.

Regarding the signals described herein, those skilled in the art will recognize that a signal may be directly transmitted from a first logic block to a second logic block, or a signal may be modified (e.g., amplified, attenuated, delayed, latched, buffered, inverted, filtered or otherwise converted, etc.) between the logic blocks. Although the signals of the above described embodiment are characterized as transmitted from one block to the next, other embodiments of the invention may include modified signals in place of such directly transmitted signals as long as the informational and/or functional aspect of the signal is transmitted between blocks. To some extent, a signal input at a second logic block may be conceptualized as a second signal derived from a first signal output from a first logic block due to physical limitations of the circuitry involved (e.g., there will inevitably be some attenuation and delay). Therefore, as used herein, a singular signal reference may include a second signal derived from a first signal, the first signal and any modifications to the first signal, whether such modifications are due to circuit limitations or are due to passage through other circuit elements which do not change the informational and/or final functional aspect of the first signal.

Although an attempt has been made to outline a few exemplary variations, other variations are within the scope of invention as defined in the claims below.

What is claimed is:

1. A composite digital-to-analog converter (DAC) comprising:
    a first DAC having a first range and a first error;
    a second DAC having a second range and a second error, the second range being less than the first range and greater than the first error, the second error being less than the first error; and
    control circuitry for alternately selecting between the first DAC and the second DAC; wherein
        the composite DAC has a composite range and a composite error; and
        the second DAC is coupled to minimize the composite error such that the composite DAC has the first range and the second error.

2. A composite DAC as recited in claim 1, wherein
    the first DAC has a first resolution;
    the second DAC has a second resolution; and
    the composite DAC has the second resolution.

3. A composite DAC as recited in claim 2, wherein
    the first resolution equals the second resolution.

4. A composite DAC as recited in claim 1, wherein the first and second DACs are MOS-based DACs.

5. A composite DAC as recited in claim 4, wherein the first and second DACs are MOS R-2R DACs.

6. A composite DAC as recited in claim 1, wherein the composite DAC is a differential composite DAC.

7. A composite DAC as recited in claim 1, wherein the first and second DACs are binarily weighted DACs.

8. A composite DAC as recited in claim 1, further comprising:
    a third DAC having a third range and a third error, the third range being less than the second range and more than the second error; the third error being less than the second error, the third DAC being coupled to minimize the composite error such that the composite DAC has the first range and the third error.

9. A composite DAC as recited in claim 1, wherein the composite DAC is comprised within a self-calibration circuit, the self-calibration circuit comprising:
    an analog circuit coupled to the composite DAC, the analog circuit having an offset; and
    control circuitry coupled to the composite DAC to successively couple the first and second DACs to the analog circuit to compensate the offset of the analog circuit.

10. An apparatus comprising a composite DAC, the composite DAC comprising:
    a first DAC having a first range and a first error;
    a second DAC having a second range and a second error, the second range being less than the first range and more than the first error; the second DAC being coupled to minimize error of the composite DAC such that the composite DAC has the first range and the second error; and
    a selection circuit coupled to the first and second DACs for alternately selecting one of the first and second DACs.

11. An apparatus as recited in claim 10, further comprising:
    an analog circuit having an offset value, the composite DAC being coupled to compensate the offset value by providing a calibration value, the calibration value being opposite to the offset value and having a magnitude within the second error of a magnitude of the offset value.

12. An apparatus as recited in claim 11, further comprising:
    an SAR circuit coupled to control the composite DAC to alternately couple the first and second DACs to the analog circuit.

13. An apparatus as recited in claim 12, wherein the SAR circuit comprises:
    control circuitry to selectively couple the first DAC to the analog circuit to compensate the offset; and
    control circuitry to selectively couple the first DAC to the analog circuit to compensate the offset upon completion of compensation of the offset by the first DAC.

14. An apparatus as recited in claim 11, wherein the analog circuit is an amplifier.

15. An apparatus as recited in claim 11 wherein the offset value and the calibration value are voltage values.

16. An apparatus as recited in claim 11 wherein the offset value and the calibration value are current values.

17. An apparatus as recited in claim 11 wherein the offset value and the calibration value are differential values.

18. An apparatus as recited in claim 10, wherein the first DAC has a first resolution;

the second DAC has a second resolution; and the composite DAC has the second resolution.

19. An apparatus as recited in claim 18, wherein the first resolution equals the second resolution.

20. A method of minimizing analog circuit offset, the method comprising:

operating a first DAC to calibrate an analog signal to within a first DAC error of a target value; and operating a second DAC to calibrate the analog signal to within a second DAC error of the target value after operating the first DAC, the second DAC having a range less than a range of the first DAC and greater than the first DAC error.

21. A method as recited in claim 20, further comprising:

isolating an analog circuit providing the analog signal by setting inputs and outputs of the analog circuit to a reference potential, the target value being equal to the reference potential.

22. A method as recited in claim 21 wherein the operating the first DAC to calibrate the analog signal comprises:

comparing the inputs of the analog circuit to provide an analog offset indication;

generating a digital calibration value responsive to receiving the analog offset indication;

converting the digital calibration value to an analog calibration value by the first DAC, the analog calibration value being equal and opposite to the offset value to within the first DAC error; and calibrating the analog circuit to compensate for the offset value by applying the analog calibration value to the analog circuit.

23. A method as recited in claim 22 wherein the operating the second DAC to calibrate the analog signal comprises:

comparing the inputs of the analog circuit to provide an analog offset indication;

generating a digital calibration value responsive to receiving the analog offset indication;

converting the digital calibration value to an analog calibration value by the second DAC, the analog calibration value being equal and opposite to the offset value to within the second DAC error; and calibrating the analog circuit to compensate for the offset value by applying the analog calibration value to the analog circuit.

24. A method as recited in claim 23, further comprising:

coupling the analog circuit by switching the inputs and outputs of the analog circuit to normal operation nodes.

25. A method as recited in claim 20, further comprising:

operating a third DAC to calibrate the analog signal to within a third DAC error of the target value after operating the second DAC, the third DAC having a range less than the range of the second DAC and greater than the second DAC error.

* * * * *